(12) United States Patent
Adcock (10) Patent No.: US 6,384,751 B1
(45) Date of Patent: May 7, 2002

(54) DATA COMPRESSION/DECOMPRESSION CIRCUIT AND METHOD

(75) Inventor: James W. Adcock, Stillwater, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/745,981

(22) Filed: Dec. 22, 2000

(51) Int. Cl.[7] ................................................. H03M 7/00
(52) U.S. Cl. ........................... 341/106; 341/51; 341/87
(58) Field of Search ............................ 341/51, 87, 106

(56) References Cited

U.S. PATENT DOCUMENTS 6,188,333 B1 * 2/2001 Cooper ......................... 341/51
6,218,970 B1 * 4/2001 Jaquette ....................... 341/106

* cited by examiner

*Primary Examiner*—Howard L. Williams
(74) *Attorney, Agent, or Firm*—Charles A. Johnson; Mark T. Starr; Crawford, PLLC (57) ABSTRACT

A method and circuit for compression and decompression of data. For compression, successive units of input data are received in first register and second registers. The contents of the registers are used to address a lookup RAM, and the data stored in the lookup RAM is used to address a dictionary RAM. If output data from the dictionary RAM does not match output data from the first and second registers, a value from a dictionary counter is stored in the lookup RAM. If output data from the dictionary RAM matches output data from the first and second registers, data read from the lookup RAM is fed back for storage in the first register. The data from the first and second registers is provided as compressed output data. For decompression, the compressed data are used to populate another dictionary RAM, which is used to reconstruct the uncompressed data.

15 Claims, 7 Drawing Sheets

102

|   | 0...8 | 9...17 | 18...26 | 27...35 |
|---|---|---|---|---|
| 0 | 060 | 060 | 060 | 061 |
| 1 | 060 | 060 | 060 | 062 |
| 2 | 060 | 060 | 060 | 063 |
| 3 | 060 | 060 | 060 | 064 |
| 4 | 060 | 060 | 060 | 065 |
| 5 | 060 | 060 | 060 | 066 |
| 6 | 060 | 060 | 060 | 064 |
| 7 | 060 | 060 | 060 | 065 |

| address | data |
|---|---|
| ... | |
| 0060 060 | 1000 |
| 0060 061 | 1001 |
| ... | |
| 0062 060 | 1003 |
| ... | |
| 1000 060 | 1002 |
| ... | |
| 1000 063 | 1004 |
| ... | |
| 1000 065 | 1009 |
| ... | |
| 1002 064 | 1005 |
| 1002 065 | 1006 |
| 1002 066 | 1007 |
| ... | |
| 1005 060 | 1008 |

| address | data |
|---|---|
| 1000 | 0060 060 |
| 1001 | 0060 061 |
| 1002 | 1000 060 |
| 1003 | 0062 060 |
| 1004 | 1000 063 |
| 1005 | 1002 064 |
| 1006 | 1002 065 |
| 1007 | 1002 066 |
| 1008 | 1005 060 |
| 1009 | 1000 065 |

DATA COMPRESSION/DECOMPRESSION CIRCUIT AND METHOD

FIELD OF THE INVENTION

The present invention generally relates to loss-less data compression and decompression.

BACKGROUND OF THE INVENTION

Data compression systems are known in the prior art that encode a stream of digital data signals into compressed digital data signals and decode the compressed digital data signals back into the original data signals. Data compression refers to any process that converts data in a given format into an alternative format having fewer bits than the original. The objective of data compression systems is to effect a savings in the amount of storage required to hold or the amount of time required to transmit a given body of digital information. The compression ratio is defined as the ratio of the length of the encoded output data to the length of the original input data. The smaller the compression ratio, the greater will be the savings in storage or time. By decreasing the required memory for data storage or the required time for data transmission, compression results in a monetary savings. If physical devices such as magnetic disks or magnetic tape are utilized to store the data files, then a smaller space is required on the device for storing the compressed data thereby utilizing fewer disks or tapes. If telephone lines or satellite links are utilized for transmitting digital information, then lower costs result when the data is compressed before transmission. Data compression devices are particularly effective if the original data contains redundancy such as having symbols or strings of symbols appear with high frequency. A data compression device transforms an input block of data into a more concise form and thereafter translates or decompresses the concise form back into the original data in its original format.

For example, it may be desired to transmit the contents of a daily newspaper via satellite link to a remote location for printing thereat. Appropriate sensors may convert the contents of the newspaper into a data stream of serially occurring characters for transmission via the communication link. If the millions of symbols comprising the contents of the newspaper were compressed before transmission and reconstituted at the receiver, a significant amount of transmission time would be saved.

To be of practical and general utility, a digital data compression system should satisfy certain criteria. The system should provide high performance with respect to the data rates provided by and accepted by the equipment with which the data compression and decompression systems are interfacing. High performance is necessary to maintain the data rates achieved in present day disk, tape, and communication systems. Thus, the data compression and decompression systems must have data bandwidths matching the bandwidths achieved in modem devices. The performance of prior art data compression and decompression systems is typically limited by the speed of the random access memories (RAM) that are used to store statistical data and guide the compression and decompression processes. High performance for a compression device is characterized by the number of read and write operations required per input character into the compressor. The fewer the number of memory cycles, the higher the performance.

Another important criterion in the design of a data compression and decompression system is compression effectiveness. Compression effectiveness is characterized by the compression ratio of the system. The compression ratio is the ratio of data storage size in compressed form divided by the size in uncompressed form. In order for data to be compressible, the data must contain redundancy. Compression effectiveness is determined by how effectively the compression procedure matches the forms of redundancy in the input data. In typical computer stored data, e.g. arrays of integers, text or programs and the like, redundancy occurs both in the nonuniform usage of individual symbology, e.g. digits, bytes, or characters, and in frequent recurrence of symbol sequences, such as common words, blank record fields, and the like. An effective data compression system should respond to both types of redundancy.

A further criterion important in the design of data compression and decompression systems is that of adaptability. Many prior art data compression procedures require prior knowledge, or the statistics, of the data being compressed. Some prior art procedures adapt to the statistics of the data as it is received. Adaptability in the prior art processes has required an inordinate degree of complexity. An adaptive compression and decompression system may be utilized over a wide range of information types, which is typically the requirement in general purpose computer facilities. It is desirable that the compression system achieves good compression ratios without prior knowledge of the data statistics. Data compression and decompression procedures currently available are generally not adaptable and so cannot be utilized for general purpose usage.

A method and apparatus that addresses the aforementioned problems, as well as other related problems, are therefore desirable.

SUMMARY OF THE INVENTION

In various embodiments, the invention provides a method and circuit are provided for compressing and decompressing data. For compression, successive units of input data are received in first register and second registers. The contents of the registers are used to address a lookup RAM, and the data stored in the lookup RAM is used to address a dictionary RAM. If output data from the dictionary RAM does not match output data from the first and second registers, a value from a dictionary counter is stored in the lookup RAM. If output data from the dictionary RAM matches output data from the first and second registers, data read from the lookup RAM is fed back for storage in the first register. The data from the first and second registers is provided as compressed output data. For decompression, the compressed data are used to populate another dictionary RAM, which is used to reconstruct the uncompressed data.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

In various embodiments, the invention uses a dictionary RAM and a lookup RAM to compress an input stream of data. The dictionary RAM contains the compressed data ordered by address. Each entry in the dictionary RAM contains either a two-byte data value or a symbol-byte data pair, where a symbol is an address into the dictionary RAM. A symbol value in the dictionary RAM indicates a byte sequence, the value of which can be determined by reference to the dictionary RAM at the address indicated by the symbol value.

The lookup RAM is used to both access and build the data values in the dictionary RAM. The data values in the lookup RAM are addresses into the dictionary RAM, and the lookup RAM is addressed by either a two-byte data value or a symbol-byte data pair, referred to as an address string. The address string is comprised of a high-order bits and low-order bits. The high-order bits can be either a byte of input data that is padded with a selected number of bits or a symbol, and the low-order bits represent a byte of input data. The data value in the lookup RAM as addressed by an address string is the address in the dictionary RAM where the address string is stored.

The invention is described in terms of an example embodiment that accommodates 36-bit words, each word having 4 9-bit bytes. Those skilled in the art will appreciate that the invention is suitable for other word and byte sizes. Unless otherwise stated, the example data values and addresses are set forth in octal notation.

In order to better understand the operation of the various embodiments of the invention, the discussion below begins with an example that illustrates the compression of eight input data words.

Figures 1A, 1B, 1C:
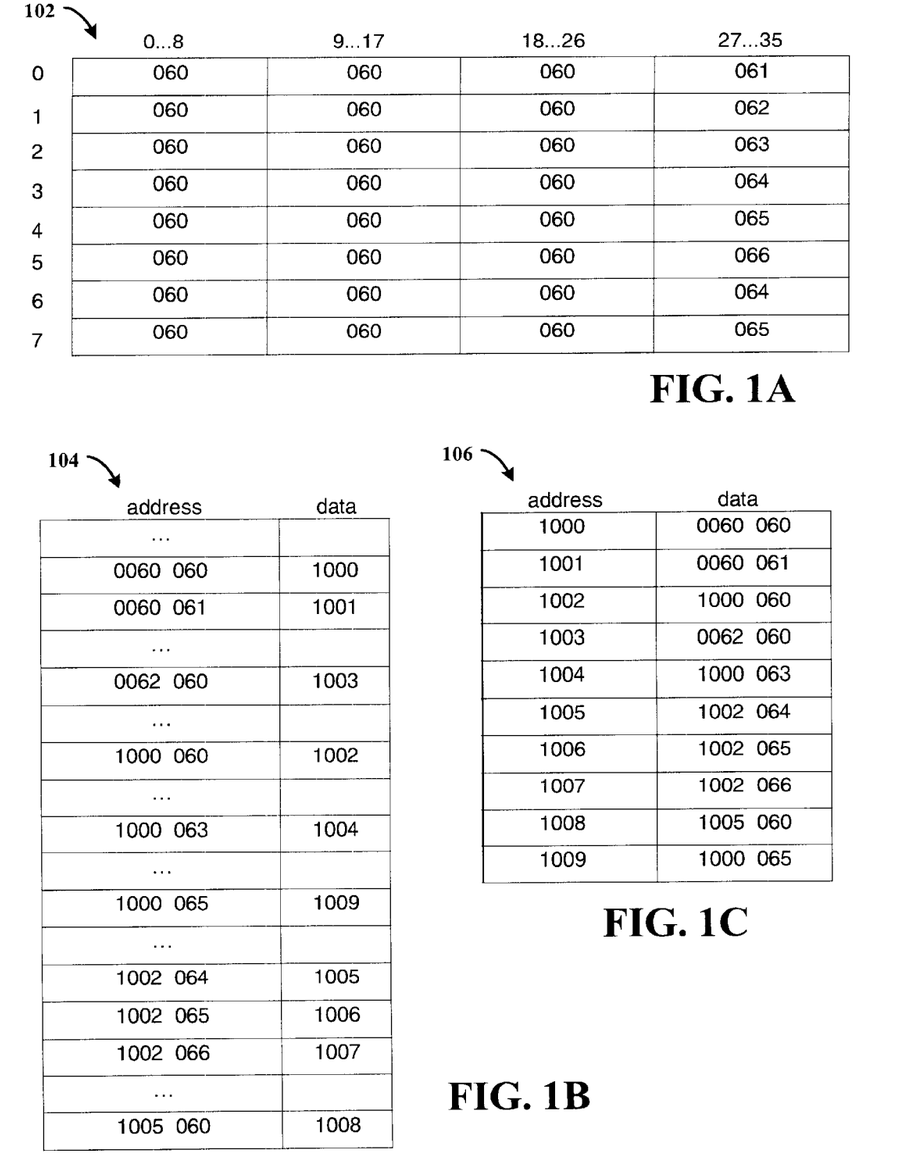
FIG. 1A is an example sequence of eight input data words.
FIG. 1B is an example lookup RAM constructed from the input sequence.
FIG. 1C is an example dictionary RAM constructed from the input sequence of FIG. 1A.

FIG. 1A is an example sequence 102 of eight input data words; FIG. 1 is an example lookup RAM 104 constructed from the input sequence 102; and FIG. 1C is an example dictionary RAM 106 constructed from the input sequence. The present discussion begins with lookup RAM 104 and dictionary RAM 106 being empty.

The example compression begins with the first two bytes of word 0 (bits 0–8 and 9–17) of sequence 102. Note that since dictionary RAM 106 is addressed by 12 bits, the high-order bits of the address string used to address lookup RAM 104 includes 12 bits. Thus, the value octal value 060 is padded with a leading 0. The low order bits are the second byte. Since at the beginning of the compression dictionary RAM 106 is empty, the address string (the first two bytes) is written to the address 1000 of dictionary RAM 106, and the address 1000 to the dictionary RAM is written to the lookup RAM at the address referenced by the address string. At this juncture, if the "060 060" sequence is repeated in sequence 102, the data will be compressed by substituting the symbol 1000 for the "060 060" sequence. At this juncture in the example, address "0060 060" of the lookup RAM has the value 1000, and address 1000 of the dictionary RAM has the value "0060 060".

The compression continues with the second two bytes of word 0 (bits 18–26 and 27–35). The address string into lookup RAM 104 is "0060 061". Since the two bytes comprising the address string have not been previously stored in dictionary RAM 106, "0060 061" is stored at address 1001 of the dictionary RAM, and symbol 1001 is stored at address "0060 061" of the lookup RAM.

The next two bytes to compress are 060 and 060 from bits 0–8 and 9–17 of word 1. The address string "0060 060" is constructed from the two bytes as described above. At address "0060 060" in lookup RAM 104 the symbol 1000 is read, and the data value "0060 060" at address 1000 in the dictionary RAM matches the two bytes. Thus, the symbol 1000 is substituted for the 12 high-order bits in the address string, and the next byte 060 (bits 18–26) is used for the 9 low-order bits in the address string. The new address string is now "1000 060".

Having not previously stored a symbol in the lookup RAM 104 at address "1000 060", the address of the next entry in the dictionary RAM 106 is stored therein. Thus, symbol 1002 is stored at "1000 060" in the lookup RAM, and "1000 060" is stored at address 1002 in the dictionary RAM.

The next two bytes to process are bits 27–35 of word 1 and bits 0–8 of word 2. The resulting address string is "0062 060". Since no symbol has been previously stored in the lookup RAM 104 at address "0062 060", the address of the next entry in the dictionary RAM is stored. Thus, symbol 1003 is stored at "0062 060", and "0062 060" is stored at address 1003 in the dictionary RAM.

The address string "0060 060" is formed from the next two bytes (bits 9–17 and 18–26 of word 2). Since address "0060 060" of the lookup RAM has the symbol 1000 and the data value at address 1000 of the dictionary RAM matches the address string, the symbol 1000 is substituted for the 12 high-order bits in the address string. The next byte in the input sequence 102 (bits 27–35) is used for the 9 low-order bits in the address string, and the new address string is "1000 063".

Having not previously stored a symbol in the lookup RAM 104 at address "1000 063", the address of the next entry in the dictionary RAM 106 is stored therein. Thus, symbol 1004 is stored at "1000 063" in the lookup RAM, and "1000 063" is stored at address 1004 in the dictionary RAM.

The compression process continues with the first two bytes of word 3 (bits 0–8 and 9–17), which form the address string "0060 060". As explained above, this address string references the symbol 1000 in the lookup RAM 104, and 1000 is substituted for the 12 high-order bits. The next byte (bits 18–26) is used for the 9 low-order bits, resulting in the address string "1000 060". Another substitution can be made since the new address string references symbol 1002 in the lookup RAM, and the value at address 1002 in the dictionary RAM matches the address string. Thus, the symbol 1002 is used for the high-order bits, and the next byte 064 is used for the low order bits, resulting in the address string "1002 064". Since no entry has yet been made in the lookup RAM 104 at address "1002 064", the next address (1005) of the dictionary RAM is written to the lookup RAM at address "1002 064", and "1002 064" is written to the dictionary RAM at address 1005. It will be appreciated that at this juncture, the two substitutions allowed the 36 bits of word 3 to be stored as 21 bits.

The compression process continues in the manner described above until the 8 words of data have been compressed to the data shown in dictionary RAM 106. The compressed data in the dictionary RAM 106 can then be stored or transmitted in accordance with the application in which the compression is used.

To decompress the data, a dictionary RAM is used that has the same addressing as the dictionary RAM used for compression. The data from the dictionary RAM is read in address order and reconstructed. For example, the data in dictionary RAM 106 can be decompressed as follows.

The data "0060 060" is read from address 1000. Since the leading 12 bits are data and not a symbol, the leading 0 is stripped from the data, leaving "060 060". These are the first two bytes of word 0. Similarly, the next two bytes of word 0 ("060 061") are read from address 1001.

At address 1002, the data "1000 060" is read, with the first 12 bits being a symbol. The data at address 1000 is read and substituted for the symbol, resulting in the data "060 060 060". At this juncture, the data through bits 18–26 of word 1 have been decompressed.

The data "0062 060" is read from word 1003. Since no symbol is present, the decompressed data is "062 060", which corresponds to bits 27–35 of word 1 and bits 0–8 of word 2. The data "1000 063" at address 1004 decompresses to "060 060 063", which corresponds to bits 9–35 of word 2.

At address 1005, the data "1002 064" is read. The symbol 1002 references the data "1000 060" in the dictionary RAM, which when substituted for the symbol 1002 results in "1000 060 064". Substituting again for the symbol 1000, the data expands to "060 060 060 064". This completes the decompression through word 4 of the input sequence 102. The remaining data in the dictionary RAM can be decompressed in a similar manner.

Using a last-in-first-out (LIFO) circuit arrangement, data that is compressed in a nested fashion can be decompressed in the correct order. "Nested" refers to, for example, symbol 1002 representing "1000 060", and symbol 1000 representing "0060 060".

Figure 2:
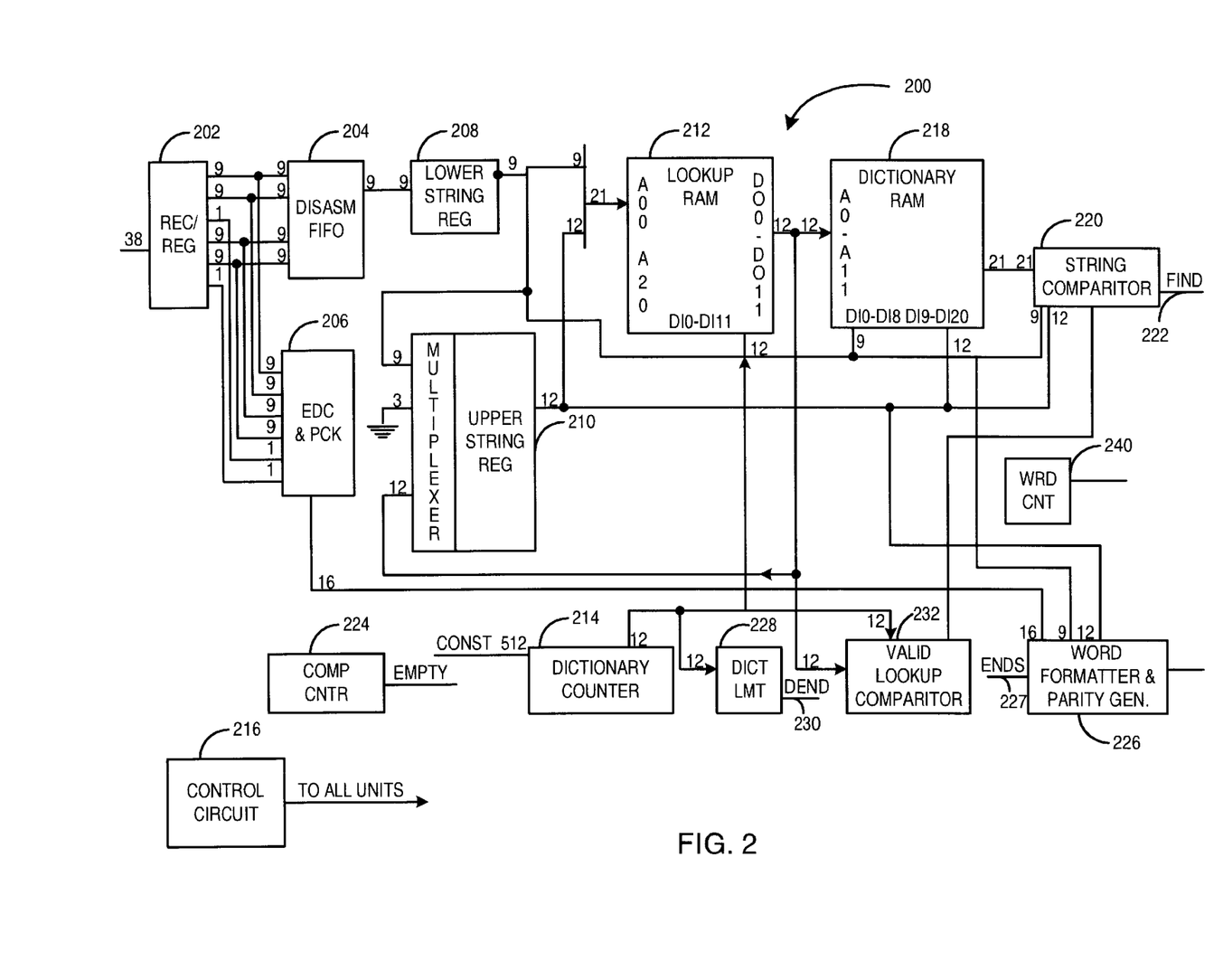
FIG. 2 is a functional block diagram of a compression circuit arrangement in accordance with one embodiment of the invention.
Figure 3A:
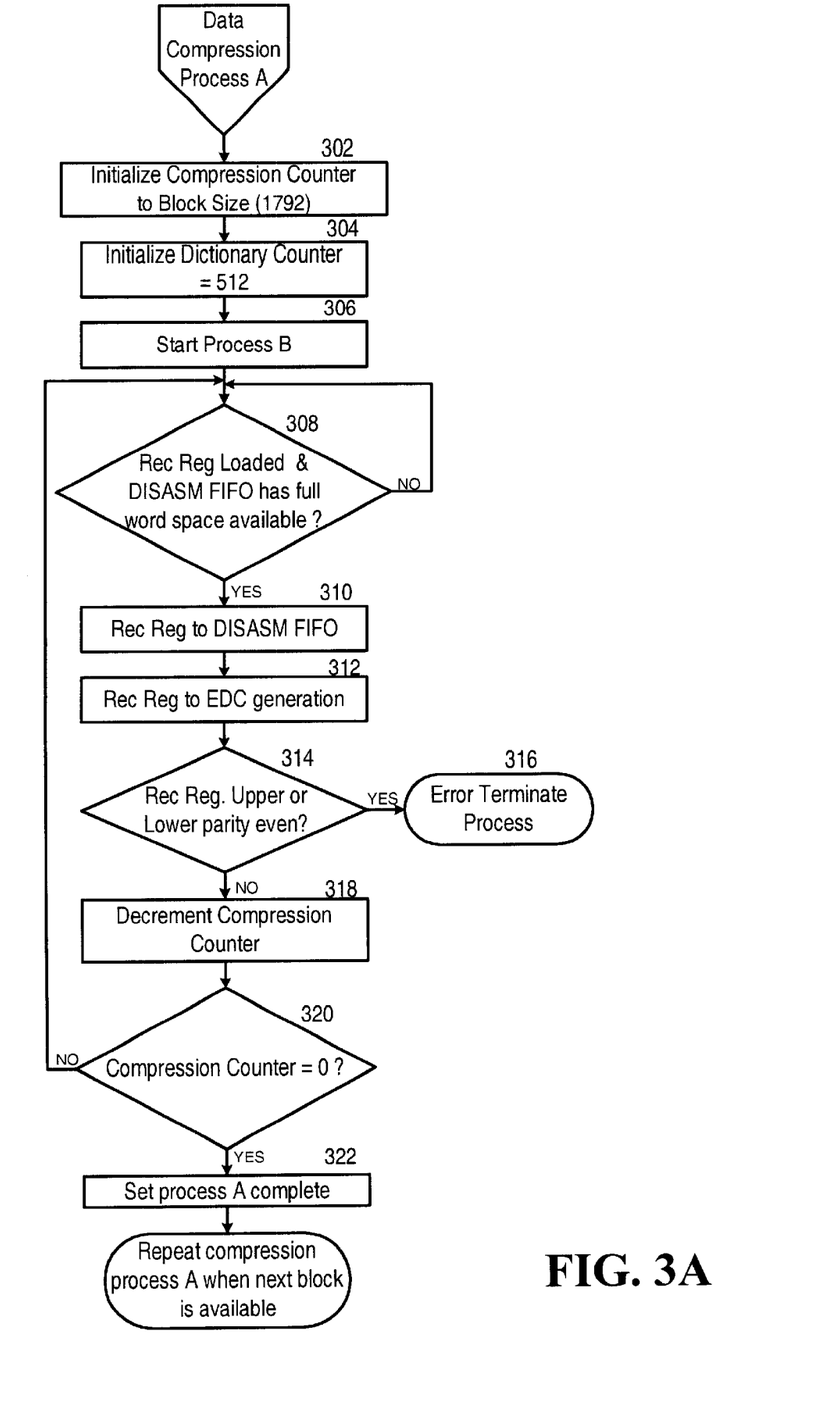
FIG. 3A is a flowchart of a compression process A.
Figure 3B:
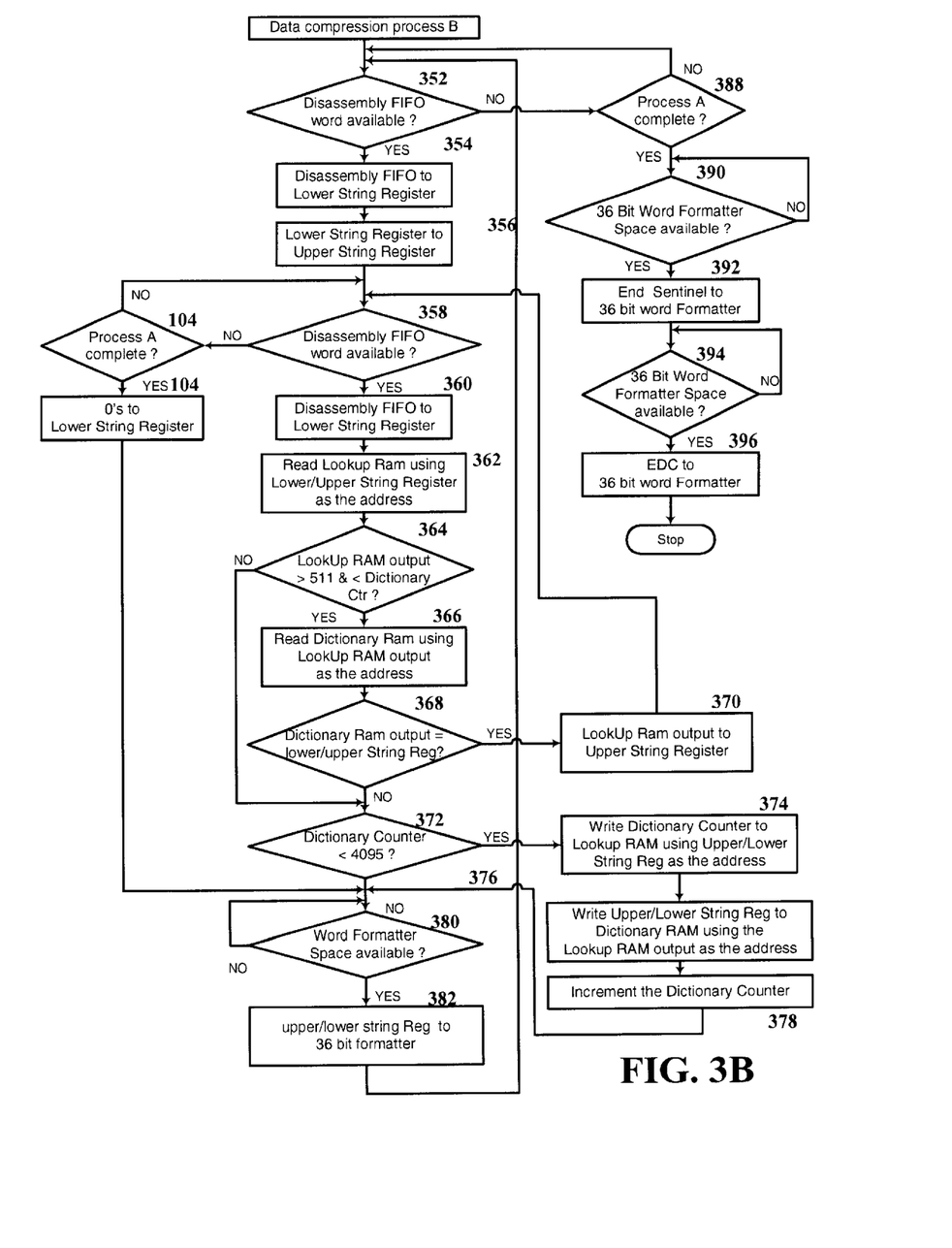
FIG. 3B is a flowchart of a compression process B, which together with compression process A, describes the operation of the compression circuit arrangement of FIG. 2.

FIG. 2 is a functional block diagram of a compression circuit arrangement 200 in accordance with one embodiment of the invention. FIGS. 3A and 3B are flowcharts that describe the operation of compression circuit arrangement 200.

Compression circuit arrangement 200 includes receive register 202 for storage of an input data word. In an example embodiment, the input data word is 38 bits (4 9-bit bytes plus two parity bits). The four bytes from receive register 204 are input to disassembly FIFO 204 and input to error detection code (EDC)/ parity check circuit 206. Circuit 206 checks parity of the input data and generates an EDC code that accompanies the compressed data that are output.

Bytes of data from disassembly FIFO 204 are input to lower string register 208, and upper string register 210 selects between a byte from lower string register 208, and a 12-bit string output from lookup RAM 212. Lookup RAM 212 is addressed with a 21-bit address constructed from the output ports of lower string register 208 and upper string register 210. In one embodiment, lookup RAM is a 2097k× 12-bit RAM. Those skilled in the art will recognize that other sizes may be suitable for other implementations, and the particular type of RAM is implementation dependent.

A 12-bit string is provided by dictionary counter for storage in lookup RAM 212 as addressed by the string registers. Dictionary counter 214 is initialized with the value 512 in an example embodiment. Before continuing, note that control circuit 216 sequences data through the compression circuit arrangement 200 and controls initialization, reset, and selection of the various circuit elements. Control circuit 216 is connected to all the units of the compression circuit arrangement.

The 12-bit string that is output from lookup RAM 212 is input on the address ports of dictionary RAM 218. The input data ports of dictionary RAM 218 are coupled to the output ports of lower string register 208 and upper string register 210. In one embodiment, dictionary RAM is a 4096×21-bit RAM. Those skilled in the art will recognize that other sizes may be suitable for other implementations, and the particular type of RAM is implementation dependent.

The data output ports of dictionary RAM 220 are coupled to string comparator 220, which compares the output string from the dictionary RAM to the 21-bit string that is comprised of the 9-bit string from the lower string register and the 12-bit string from the upper string register. If the pair of 21-bit input strings match, the find signal is activated on line 222 to the control circuit 216, which enables the feedback of the 12-bit string from the lookup RAM back to the upper string register 210.

Compression counter 224 is initialized to the number of words that are to be compressed, for example the number of words in a block of data within a file management system. It will be appreciated that in alternative embodiments, multiple blocks could be compressed. The compression counter counts the number of words that have been processed by the compression arrangement 200, and signals the control circuit 216 when all the words in the block have been processed. When a block has been compressed, control circuit 216 signals word formatter circuit 226. When space is available in storage in the word formatter, an end sentinel value is written thereto (line 227, and an EDC is also written to the storage. The end sentinel value is a data pattern of 07777/000 octal, for example. When the end sentinel value is detected in the decompression process, the logic is alerted to go to end processing.

The word formatter circuit 226 assembles the input bit strings into a word format that is suitable for output. It will be appreciated that the output format is implementation dependent.

The dictionary limit circuit 228 detects when the dictionary is full. When the dictionary is full, the DEND signal is generated on line 230 and input to control circuit 216. Once the dictionary RAM 218 is full, the input data can only be compressed with symbols already in the dictionary, no additional entries are written to the dictionary. Data pairs that have no match in the dictionary are written directly to the word formatter 226.

Valid lookup comparator circuit 232 compares the 12-bit string that is output from the lookup RAM 212 for equality with the output value from the dictionary counter 214. The comparator is used when the lookup RAM 212 address range is less than the 21 bit required by the lower and upper string registers (208 210), in which case multiple symbol/data pairs could hash to the same dictionary entry.

Word count circuit 240 counts the number of output words that have been formatted. This number changes on each 1792 word input block based on the compression level achieved.

FIG. 3A is a flowchart of a compression process A, and FIG. 3B is a flowchart of a compression process B. Together, the compression process A and compression process B describe the operation of the compression circuit arrangement 200 of FIG. 2. compression process A of FIG. 3A controls initiation and completion of the compression of a block of data, and compression process B of FIG. 3B compresses the data.

Beginning at step 302 of FIG. 3A, the compression counter 224 is initialized to the number of words in a block of input data, e.g., 1792, and at step 304, the dictionary counter 214 is initialized to 512, for example. In the example embodiment, valid nine-bit data values are in the range 0–511, and symbols are in the range of 512–4094. The value 4095 is reserved for the end sentinel value.

At step 306, the decompression process B of FIG. 3B is started.

Decision step 308 tests whether a word is available in receive register 202 and the disassembly FIFO 204 has space available (all four bytes of the previous word have been processed). If not, the test is repeated until space is available. Otherwise, control is directed to step 310. At step 310, the contents the receive register 202 are loaded into the disassembly FIFO 204, and at step 312, the contents of the receive register are input to the EDC/parity circuit 206.

Decision step 314 tests whether even parity is detected for either of the lower or upper receive register 202. The uncompressed input data is 38 bits: 18 upper bits plus one accompanying parity bit and 18 lower bits plus one accompanying parity bit. From the same data for which parity is checked a polynomial EDC is generated. This allows error checking in either the data compression or expansion.

If even parity is detected, control is directed to step 316 where the decompression process A is terminated and process A is marked as complete. Otherwise, control is directed to step 318.

At step 318, the compression counter is decremented, and decision step 320 compares the value of the compression counter to 0. When the compression counter reaches zero, all the words in a block have been compressed, and control is directed to step 322. Otherwise, control is returned to step 308 to load the next word of data. When compression of a block is complete, the process is repeated on the next block.

FIG. 3B is a flowchart of the decompression process B that describes in part the operation of compression arrangement 200 of FIG. 2. Decision step 352 tests whether a word is available in disassembly FIFO 204. If so, the first byte of the word is loaded into the lower string register 208 at step 354, and at step 356 the contents of the lower string register are loaded into the upper string register 210.

At decision step 358, the disassembly FIFO is tested for the availability of a word. If a word is available, control is directed to step 360, where the next byte of the word is loaded into the lower string register 208. At step 362, a 12-bit word of data is read from the lookup RAM 212 as addressed by the contents of the lower and upper string registers 208 and 210.

Decision step 364 tests whether the output value from the lookup RAM 212 is greater than 511 and less than the value maintained by the dictionary counter 214. If so, control is directed to step 366 where the dictionary RAM is read as addressed by the value output by the lookup RAM 212. At decision step 368, the 21-bit value read from the dictionary RAM 218 is compared to the 21-bit string of the lower and upper string registers 208 and 210. If the values are equal, control is directed to step 370, where the output value from the lookup RAM 212 is fed back and stored in upper string register 210. Control is then returned to decision step 358 to process the next byte in the disassembly FIFO 204.

If the 21-bit value read from the dictionary RAM 218 is not equal to the 21-bit string of the lower and upper string registers 208 and 210, decision step 368 directs control to decision step 372. If there is still room in the dictionary, as indicated by the dictionary counter, decision step 372 directs control to step 374. At step 374, the value from the dictionary counter 214 is written to the lookup RAM at the address referenced by the contents of the lower and upper string registers 208 and 210, and at step 376 the contents of the lower and upper string registers are written to the dictionary RAM 218 as addressed by the output value from the lookup RAM 212. The dictionary counter is incremented at step 378, and control is then directed to decision step 380.

At decision step 380, the process checks for available space in the word formatter 226 and waits until space is available. It will be appreciated that circuitry on receiving data from word formatter 226 may not be reading data from the formatter at the same rate that data is compressed.

At step 382, the contents of the lower and upper string registers 208 and 210 are input to the word formatter, and control is returned to decision step 352.

If decision step 358 finds that there is not a word available in the disassembly FIFO 204, control is directed to decision step 384 to test whether the compression process A has found the end of a block. If process A is complete, step 386 stores a string of 0 bits in the lower string register 208, and processing continues at decision step 380.

Decision step 352 directs control to decision step 388 if there is not a word available in the disassembly FIFO 204. If compression process A is complete, control is directed to decision step 390, which tests whether there is space available in the word formatter 226. When space is available, step 392 writes an end sentinel (code that indicates the end of a block) to the word formatter. Decision step 394 tests whether space is available in the word formatter, and when space is available an EDC is written to the formatter at step 396 to complete the compression of the block of data.

Figure 4:
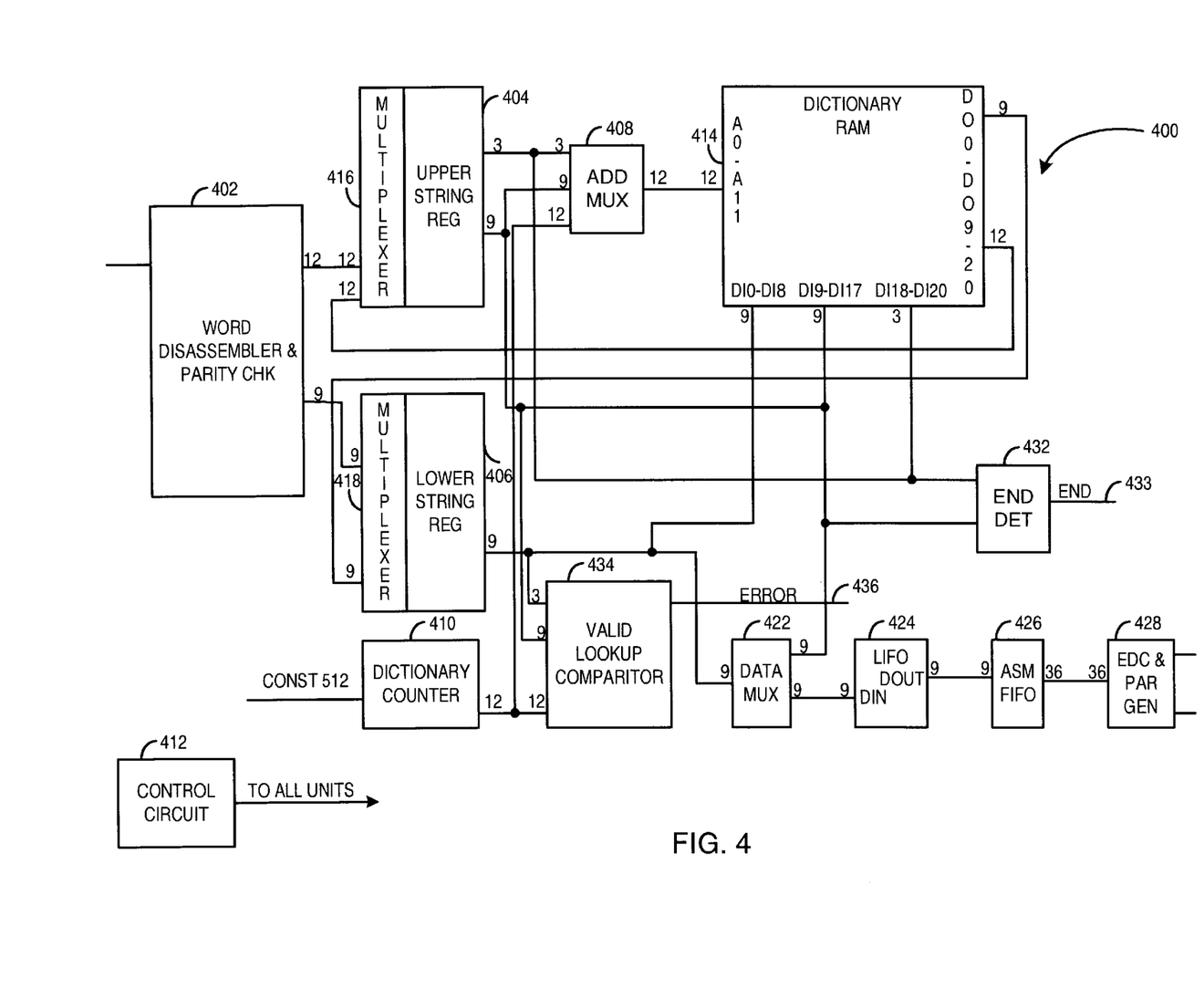
FIG. 4 is a functional block diagram of a decompression circuit arrangement in accordance with an example embodiment of the invention.

FIG. 4 is a functional block diagram of a decompression circuit arrangement 400 in accordance with an example embodiment of the invention. The operation of decompression circuit arrangement 400 is described below and further detailed in the flowcharts of FIGS. 5A and 5B.

Decompression circuit arrangement 400 includes a word disassembler circuit 402 that first checks the parity of an input word and disassembles an input words from a first format (e.g., 36-bit words) into pairs of 12-bit and 9-bit strings. The 12-bit string from the word disassembler is input to upper string register 404, and the 9-bit string from the word disassembler is input to lower string register 406. Since the upper 12 bits may either an address into the dictionary RAM 414 or a byte of data (e.g., 9 bits with 3 leading "0" bits), 9 bits of the upper 12 bits are input to the mux 422 for output.

Address multiplexer 408 selects either the 12-bit string from the upper string register 404 or the output value from dictionary counter 410, which is initialized to the value 512, for example. Control circuit 412 controls the sequence of data through decompression arrangement 400 and is connected to all units for initialization, reset, data selection, and providing overall control of the decompression operation. The function of the control circuit will be further detailed in the flowcharts of FIGS. 5A and 5B.

The output 12-bit string from address mux 408 is provided to the address ports of dictionary RAM 414. The characteristics of dictionary RAM 414 are the same as the characteristics of dictionary RAM 218 of FIG. 2. The data input ports of the dictionary RAM 414 are coupled to the output ports of the upper string register 404 and the lower string register 406. Thus, input data are stored in the dictionary RAM 414 at the direction of control circuit 412 and addressed by the string registers.

The output data ports of the dictionary RAM 414 are coupled to the multiplexers 416 and 418, which select the input data to the upper and lower string registers 404 and 406. Thus, the data read from dictionary RAM 414 are used for addressing compressed data within the RAM and for constructing the decompressed output data. The 9-bit string that is output from lower string register 406 is as input data to mux 422 along with 9 bits of the data from the upper string register 404.

The byte selected from mux 422 is input to last-in-first-out (LIFO) circuit arrangement 424. Bytes of data are input to LIFO arrangement 424 as referenced by an input-select signal from control circuit 412 and bytes of data are selected for output from the LIFO arrangement as referenced by an output-select signal from the control circuit. The specific operation of the LIFO arrangement, input of data, and output of data are further described in the flowcharts of FIGS. 5A and 5B.

Assembly FIFO 426 receives bytes of data from the LIFO arrangement 424 and constructs a data word for output, the size of the data word being implementation dependent. The data word is input to EDC/parity generator 428, which provides the data word as output and generates parity bits and an EDC.

End detection circuit 432 is coupled to the output ports of upper string register 404 and compares the 12-bit string from the upper string register to a selected 12-bit end sentinel. If the values are equal, an end signal is generated on line 433 to signal to the control circuit 412 that the end of the data has been reached.

Valid-lookup comparitor circuit 434 is coupled to the output ports of the dictionary counter 410 and the upper string register 404. If the value of the 12-bit string from the upper string register is greater than or equal to the dictionary counter, an error signal is generated on line 436 to control circuit 412. The error signal causes control circuit 412 to terminate the decompression of the input data.

Figure 5A:
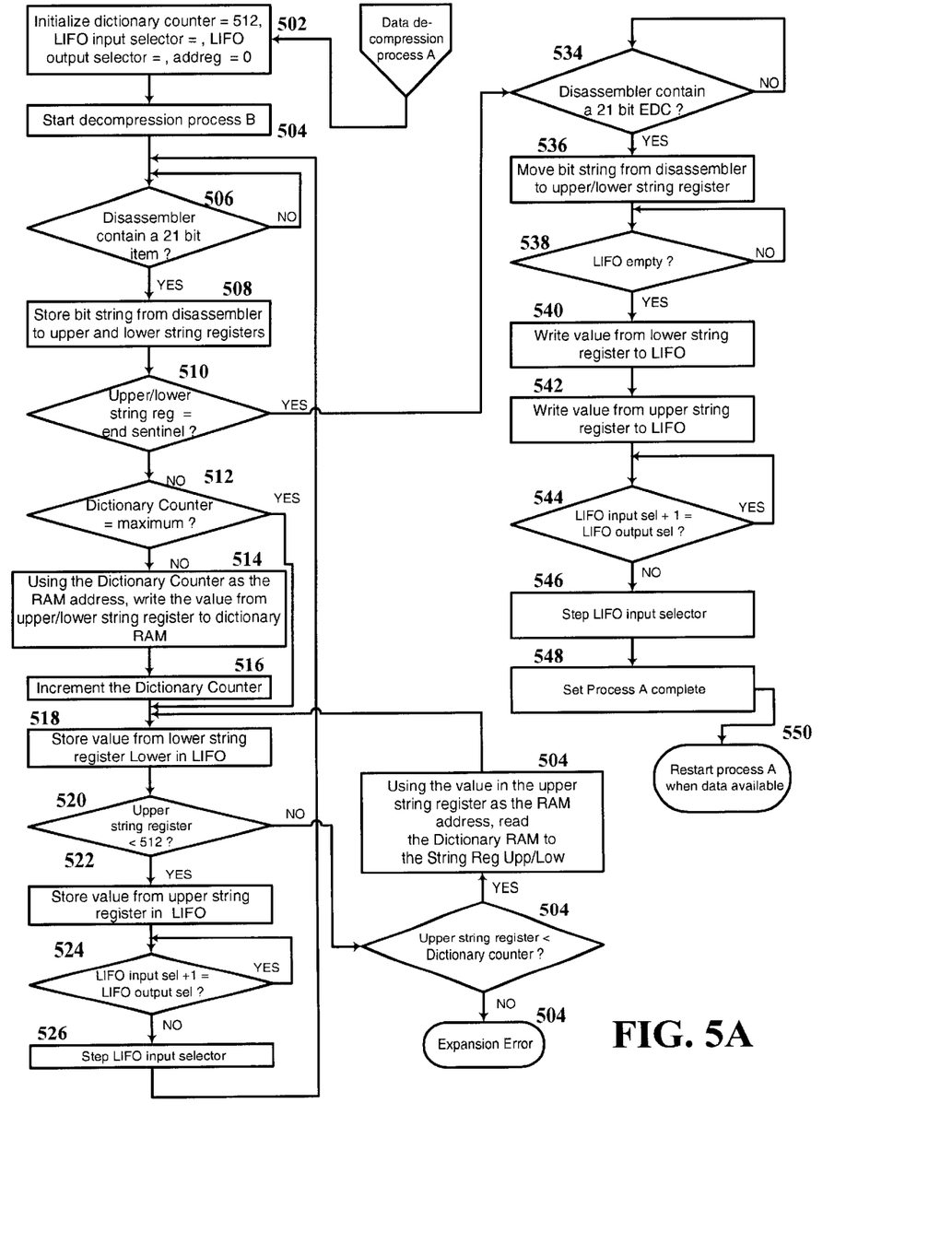
FIG. 5A is a flowchart of a decompression process A of the decompression arrangement of FIG. 4.
Figure 5B:
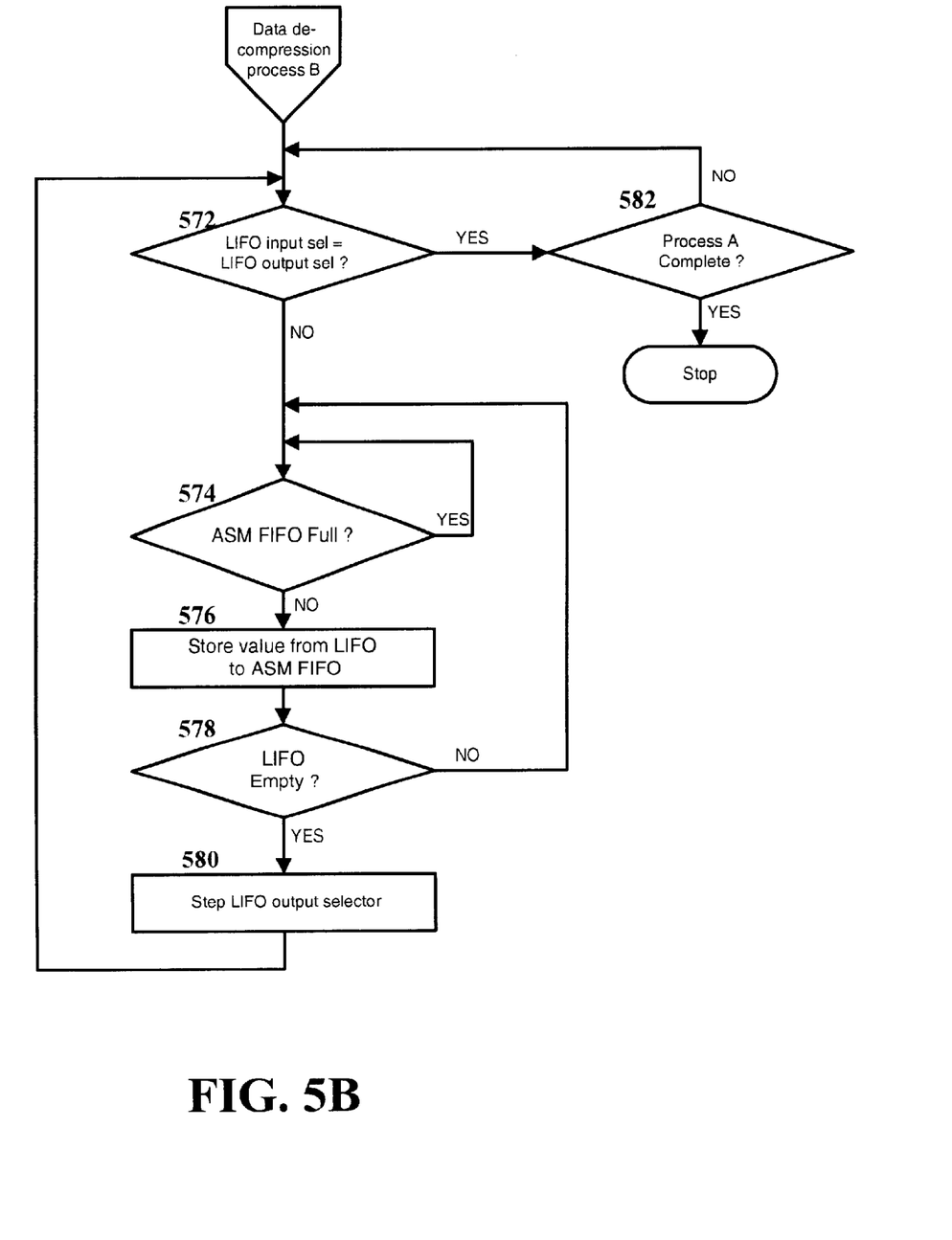
FIG. 5B is a flowchart of decompression process B, which together with decompression process A, describes the operation of the decompression circuit of FIG. 4.

FIG. 5A is a flowchart of a process that describes the decompression process of decompression arrangement 400, and FIG. 5B is a flowchart of the processing performed by the decompression arrangement in assembling decompressed output data. The process of FIG. 5A is referred to as "decompression process A", and the process of FIG. 5B is referred to as "decompression process B".

At step 502 of decompression process A, the dictionary counter 410 is initialized to 512, and the input and output selectors (not shown) for LIFO circuit 424 are initialized to zero. The input selector and the output selector are both two-bit counters that count from zero to three. LIFO circuit 424 also includes four 12-bit address registers (not shown) that are up/down counters. The address registers are also initialized to zero. An example implementation of the LIFO 424 divides a 167384×9 RAM into four sections. This allows the input section and the output section to have simultaneous access to the LIFO provided they are operating in different sections. There is a cycle A clocking signal, which is a 50% duty cycle, that allows each section to time multiplex access to the LIFO memory.

In another embodiment, a single section LIFO could be used. However, the output section would have to wait on the input section while expanding a chain of symbols, and the input section would have to wait on the output section while emptying the LIFO into the ASM FIFO 426.

At step 504, decompression process B of FIG. 5B is started. Decision step 506 tests whether word disassembler circuit 402 contains a 21-bit string of data and waits until a bit string is available before directing control to step 508. At step 508, the upper 12-bit string from the word disassembler is stored in the upper string register 404 and the lower 9-bit string is stored in lower string register 406. At decision step 510, end detection circuit 432 compares the 12-bit string from the upper string register 404 to a selected end sentinel. If there is still data to process, control is directed to decision step 512.

At decision step 512, the dictionary counter is compared to the maximum value allowed for the dictionary counter. When the dictionary counter reaches the maximum value, the dictionary RAM 414 is full and no more data can be stored therein. If the dictionary RAM is not full, control is directed to step 514.

At step 514, the 21-bit string from the upper and lower string registers 404 and 406 is stored in the dictionary RAM 414 at the address indicated by the dictionary counter 410, and the dictionary counter is incremented at step 516. The 9-bit string from the lower string register 406 is selected for input to the LIFO circuit 424 at step 518.

Decision step 520 tests whether the value of the 12-bit string in the upper string register 404 is less than the initial value of the dictionary counter. The lowest value of the dictionary counter is used to distinguish a byte of data from a symbol that is used to address the dictionary RAM 414. Control is directed to step 522 if a byte is found. At step 522, the lower 9 bits of the 12-bit string from the upper string register 404 is selected for input to LIFO circuit 424.

Decision step 524 tests whether the value of the LIFO input selector plus 1 is equal to the value of the LIFO output selector. Decompression process B of FIG. 5B maintains the output selector.

The input selector is used to select the section of LIFO memory that is currently being used to expand the data from the compression symbol chain. When the input section detects the end of the symbol chain expansion, it steps to the next section of the LIFO. The Output section can than empty the section that was just filled by the input section. At step 526, the LIFO input selector is incremented (the sequence being 0, 1, 2, 3, 0, 1, 2, 3, . . . ). Returning to decision step 520, if the 12-bit string in the upper string register 404 is an address for dictionary RAM 414, control is directed to decision step 528. Decision step 528 tests whether the value from the upper string register is less than the value of the dictionary counter. If not, the input data is corrupt and an the process is terminated with an error signal at step 530. Otherwise, control is directed to step 532 where a 21-bit string is read from the dictionary RAM, as addressed by the 12-bit string from the upper string register, and the upper 12 bits of the value are stored in the upper string register and the lower 9 bits of the value are stored in the lower string register. Control is then directed to step 518, and the processing continues as described above. Returning now to decision step 510, when the end sentinel is found, control is directed to decision step 534, which tests whether a 21-bit EDC is present in the word disassembler 402. When the EDC is available, control is directed to step 536 where the EDC is stored in the upper and lower string registers 404 and 406. Decision step 538 tests whether the LIFO circuit 424 is empty as determined by the value of the input selector. The LIFO address register is incremented when writing data to the LIFO and decremented when reading data from the LIFO. If the selected address register is equal to zero, then the borrow signal from the address counter will indicate that the LIFO section is empty.

Once the LIFO circuit is empty, control is directed to step 540 where the lower 9 bits of the EDC from the lower string register 406 are stored in the LIFO circuit. At step 542, the upper 9 bits of the EDC (the lower 9 bits from the upper string register 404) are stored in the LIFO circuit.

Decision step 544 tests whether the value of the LIFO input selector plus 1 is equal to the value of the LIFO output selector. When the value of the LIFO input selector plus 1 is not equal to the value of the LIFO output selector, control is directed to step 546 where the LIFO input selector is stepped. At step 548, a signal is generated to indicate that decompression process A is complete. The decompression process A is restarted when a new block of data is available.

FIG. 5B is a flowchart of a process that describes extraction of decompressed data from the LIFO circuit 424 in the decompression arrangement 400. Decision step 572 tests whether the value of the LIFO input selector is equal to the value of the LIFO output selector. When the values are not equal, there is data available in the LIFO, and control is directed to decision step 574. Decision step 574 tests whether the assembly FIFO 426 is fill and directs control to step 576 when space is available. At step 576, a byte from the LIFO circuit 424 as selected by the LIFO output selector is written to the assembly FIFO 426. Decision step 578 tests whether the LIFO circuit 424 is empty, as determined by the value of the LIFO output selector. Control is returned to decision step 574 if the LIFO circuit is not empty. Otherwise, control is directed to step 580 where the LIFO output selector is stepped. The LIFO output selector is stepped by incrementing the value in the sequence 0,1,2,3, 0,1,2,3, . . . Control is then returned to decision step 572, and processing continues as described above.

When the value of the LIFO input selector is equal to the value of the LIFO output selector, decision step 572 directs control to decision step 582. When decompression process A (FIG. 5A) is complete, decompression process B stops. Otherwise, control is returned to decision step 572 to wait for more decompressed data.

Accordingly, the present invention provides, among other aspects, a data compression and decompression circuit and method. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. In a data-compression and data-decompression method, a compression method for compressing a stream of units of data, comprising:

receiving successive units of input data in a first register and in a second register;

addressing a lookup RAM using data in the first and second registers;

addressing a dictionary RAM using output data from the lookup RAM;

if output data from the dictionary RAM does not match output data from the first and second registers, storing a value from a dictionary counter in the lookup RAM and incrementing the dictionary counter;

feeding back data read from the lookup RAM for storage in the first register if output data from the dictionary RAM matches output data from the first and second registers; and providing data from the first and second registers as compressed output data.

2. The method of claim 1, further comprising:

generating an error detection code for a selected number of units of data comprising a block; and providing the error detection code as output data after compressing the block of data.

3. The method of claim 1, further comprising bypassing storage of subsequent units of data in the lookup RAM and dictionary RAM if the dictionary RAM is full.

4. In the data-compression and data-decompression method of claim 1, a decompression method for recovering output data from the compression method, comprising:

storing successive units of input data in a third register and in a fourth register;

writing the units of data from the third and fourth registers to a second dictionary RAM as addressed by a second dictionary counter;

storing the unit of data from the fourth register in a last-in-first-out data circuit;

if the input data in the third register is an address to the second dictionary RAM, then reading data from the second dictionary RAM, as addressed by the third register, into the third and fourth registers, and repeating the steps of storing the unit of data in the last-in-first-out circuit and conditionally reading data from the second dictionary RAM until the unit of data in the third register is an not an address to the second dictionary RAM; and repeating the decompression steps until a selected number of units of data have been decompressed.

5. In a data-compression and data-decompression apparatus, a compression apparatus for compressing a stream of units of data, comprising:

means for receiving successive units of input data in a first register and in a second register;

means for addressing a lookup RAM using data in the first and second registers;

means for addressing a dictionary RAM using output data from the lookup RAM;

means for storing a value from a dictionary counter in the lookup RAM and incrementing the dictionary counter if output data from the dictionary RAM does not match output data from the first and second registers;

means for feeding back selected a portion of a data element read from the lookup RAM for storage in the first register if output data from the dictionary RAM matches output data from the first and second registers; and means for providing data from the first and second registers as compressed output data.

6. In the data-compression and data-decompression apparatus of claim 5, a decompression apparatus for recovering compressed data, comprising:

means for storing successive units of input data in a third register and in a fourth register;

means for writing the units of data from the third and fourth registers to a second dictionary RAM as addressed by a second dictionary counter;

means for storing the unit of data from the fourth register in a last-in-first-out data circuit;

means for reading data from the second dictionary RAM, as addressed by the third register, into the third and fourth registers, and repeating storing the unit of data in the last-in-first-out circuit and conditionally reading data from the second dictionary RAM until the unit of data in the third register is an not an address to the second dictionary RAM, if the input data in the third register is an address to the second dictionary RAM; and means for resetting the dictionary counter once a selected number of units of data have been decompressed.

7. In a data-compression and data-decompression method, a compression method for compressing a stream of units of data, comprising:

(a) storing successive units of input data in a first register and in a second register;

(b) reading a dictionary address from the lookup RAM using as an address the units of data in the first and second registers;

(c) reading a data from the dictionary RAM using the dictionary address from the lookup RAM;

(d) if the data from the dictionary RAM is equal to the data in the first and second registers, then performing steps (e)–(f);

(e) storing the dictionary address from the lookup RAM in the first register;

(f) storing an input unit of data in the second register;

(g) if the data from the dictionary RAM is not equal to the data in the first and second registers, then performing steps (h)–(l);

(h) writing a dictionary counter value to the lookup RAM as addressed by the first and second registers;

(i) writing the data in the first and second registers to the dictionary RAM at the dictionary address;

(j) incrementing the dictionary counter value;

(k) providing the data in the first and second registers as compressed output data;

(l) storing two subsequent units of input data in the first and second registers;

(m) repeating steps (b)–(m) until a selected number of units of data have been processed.

8. The method of claim 7, further comprising:

(n) generating an error detection code for a selected number of units of data comprising a block; and (o) providing the error detection code as output data after compressing the block of data.

9. The method of claim 8, further comprising repeating steps (a)–(o) for subsequent blocks of data.

10. The method of claim 7, further comprising:

if the dictionary RAM is full, then bypassing storage of subsequent units of data in the lookup RAM and dictionary RAM;

providing the data in the first and second registers as output data; and storing two subsequent units of input data in the first and second registers.

11. In the data-compression and data-decompression method of claim 7, a decompression method for recovering output data from the compression method, comprising:

(p) storing successive units of input data in a third register and in a fourth register;

(q) writing the units of data from the third and fourth registers to a second dictionary RAM as addressed by a dictionary counter;

(r) incrementing the dictionary counter;

(s) storing the unit of data from the fourth register in a last-in-first-out data circuit;

(t) if the input data in the third register is an address to the second dictionary RAM, then, performing steps (u)–(v)

(u) reading data from the second dictionary RAM into the third and fourth registers, as addressed by the third register; and (v) repeating steps (s)–(t) until the input data in the third register is an not an address to the second dictionary RAM;

(w) repeating steps (p)–(w) until a block of data has been decompressed.

12. The method of claim 11, wherein the decompression method further comprises bypassing writing data to the second dictionary RAM when the dictionary counter reaches a selected maximum value.

13. The method of claim 12, wherein the decompression method further comprises resetting the dictionary counter when a block of data has been decompressed.

14. A circuit arrangement for compressing data, comprising:

a first register;

a second register arranged to receive a unit of input data;

a lookup RAM having address ports coupled to output ports of the first and second registers;

a dictionary RAM having address ports coupled to data output ports of the lookup RAM;

a dictionary counter having output ports coupled to data input ports of the lookup RAM;

a multiplexer having a first set of input ports coupled to output ports of the second register, a second set of input ports coupled to the data output ports of the lookup RAM, and a set of output ports coupled to the first register; and a control circuit coupled to the first register, the second register, the lookup RAM, the dictionary RAM, the dictionary counter, and the multiplexer, the control circuit configured and arranged to select between data from the second register and data from the lookup RAM for storage in the first register, enable storage of a value from the dictionary counter in the lookup RAM, and enable storage of data from the first and second registers in the dictionary RAM.

15. A circuit arrangement for decompressing data, comprising:

a first register;

a second register;

a dictionary RAM;

a dictionary counter;

an address multiplexer having a first set of input ports coupled to output ports of the dictionary counter, a second set of input ports coupled to output ports of the first and second registers, and a set of output ports coupled to address ports of the dictionary RAM;

a first data multiplexer having a first set of input ports arranged to receive a unit of input data and a second set of input ports coupled to a first set of data output ports of the dictionary RAM;

a second data multiplexer having a first set of input ports arranged to receive a unit of input data and a second set of input ports coupled to a second set of data output ports of the dictionary RAM;

a third data multiplexer having a first set of input ports coupled to the output ports of the first register, a second set of input ports coupled to the output ports of the second register;

a last-in-first-out (LIFO) circuit arrangement having a set of input ports coupled to output ports of the third data multiplexer; and a control circuit coupled to the first and second registers, the dictionary RAM, the dictionary counter, the address multiplexer, the first, second, and third multiplexers, and to the LIFO circuit arrangement, the control circuit configured and arranged to select an address for application to the dictionary RAM, advance the dictionary counter, select data for storage in the first and second registers, and select between data from the first and second registers for storage in the LIFO circuit arrangement.

* * * * *